(12) United States Patent
Byun et al.

(10) Patent No.: US 11,528,805 B2
(45) Date of Patent: Dec. 13, 2022

(54) DISPLAY DEVICE AND METHOD OF MANUFACTURING THE SAME

(71) Applicant: Samsung Display Co., LTD., Yongin-si (KR)

(72) Inventors: Chang Woo Byun, Hwaseong-si (KR); Jong Woo Park, Seongnam-si (KR); Shangu Kim, Seoul (KR); Young Tae Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/158,678

(22) Filed: Jan. 26, 2021

(65) Prior Publication Data

US 2021/0274653 A1     Sep. 2, 2021

(30) Foreign Application Priority Data

Mar. 2, 2020  (KR) .......................... 10-2020-0025917

(51) Int. Cl.
*H05K 1/11*     (2006.01)
*H05K 3/32*     (2006.01)
(Continued)

(52) U.S. Cl.
CPC ............ *H05K 1/111* (2013.01); *G02F 1/1345* (2013.01); *G02F 1/13452* (2013.01);
(Continued)

(58) Field of Classification Search
CPC .................. H05K 1/111; H05K 3/323; H05K 2201/09063; H05K 1/147; H05K 3/361;
(Continued)

(56) References Cited

U.S. PATENT DOCUMENTS 5,360,943 A  *  11/1994  Mori ...................... H05K 3/361
                                                174/117 FF
6,198,519 B1 *   3/2001  Chang .................... H05K 3/361
                                                        29/830

(Continued)

FOREIGN PATENT DOCUMENTS

JP          11-95245        4/1999
JP          3227778        11/2001
(Continued)

*Primary Examiner* — Steven T Sawyer
(74) *Attorney, Agent, or Firm* — Kile Park Reed & Houtteman PLLC

(57) ABSTRACT

A display device includes a substrate including a display area and a non-display area adjacent to the display area, lower pads disposed in the non-display area of the substrate and spaced apart from each other, upper pads disposed on the lower pads and spaced apart from each other, an anisotropic conductive film disposed between the lower pads and the upper pads, and a circuit film disposed on the upper pads, the circuit film including first lower holes disposed between the upper pads in a plan view, and first upper holes connected to the first lower holes and having radiuses larger than radiuses of the first lower holes. The first upper holes form first openings on an upper surface of the circuit film. A method of manufacturing the display device is provided.

14 Claims, 9 Drawing Sheets

(51) Int. Cl.
*G02F 1/1345* (2006.01)
*H01R 12/62* (2011.01)

(52) U.S. Cl.
CPC ............. *H05K 3/323* (2013.01); *H01R 12/62* (2013.01); *H05K 2201/09063* (2013.01); *H05K 2201/09845* (2013.01); *H05K 2201/10128* (2013.01)

(58) Field of Classification Search
CPC .... H05K 2201/05; H05K 1/118; H05K 1/117; H05K 3/363; H05K 2201/09481; H05K 2201/09572; H05K 2201/0969; H05K 2201/0979; H05K 2201/09854; H05K 2203/0126; H05K 2201/09845; H05K 2201/10128; H05K 1/189; H05K 1/113; G02F 2201/50; G02F 1/13452; G02F 1/1345; G02F 1/13456; H01L 27/1244; H01L 27/1248; H01L 23/4985; H01R 12/62; H01R 43/0249
See application file for complete search history.

(56) References Cited

U.S. PATENT DOCUMENTS

| | | | |
|---|---|---|---|
| 2003/0136578 A1* | 7/2003 | Kishimoto | H05K 3/462 174/255 |
| 2003/0179551 A1* | 9/2003 | Sugimoto | H05K 3/361 361/748 |
| 2004/0108132 A1* | 6/2004 | Ohazama | H05K 3/323 174/257 |
| 2014/0104794 A1* | 4/2014 | Fang | H05K 3/361 361/767 |
| 2014/0321075 A1* | 10/2014 | Sung | H01R 43/0249 361/767 |
| 2020/0236792 A1* | 7/2020 | Dong | H05K 3/323 |
| 2021/0167328 A1* | 6/2021 | Kim | H01L 51/5253 |

FOREIGN PATENT DOCUMENTS

| | | |
|---|---|---|
| JP | 6111771 | 4/2017 |
| KR | 2001-0042611 | 5/2001 |
| KR | 10-2007-0018622 | 2/2007 |
| KR | 10-1676747 | 11/2016 |

\* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0025917 under 35 USC § 119, filed on Mar. 2, 2020 in the Korean Intellectual Property Office, the entire contents of which are incorporated herein by reference.

BACKGROUND

1. Technical Field

Embodiments relate to a display device having holes and a method of manufacturing the display device having the holes.

2. Description of the Related Art

A circuit film may be used for a display device. Recently, a bendable circuit film may be used to reduce a bezel area of the display device. A flexible printed circuit board and the like are used as the bendable circuit film. When the flexible printed circuit board attached to a substrate is bent, stress may be applied to a portion where the flexible printed circuit board is attached to the substrate. Due to the stress, poor attachment between the flexible printed circuit board and substrate may result in cracking or floating where the display device is bent. Therefore, there is a need for a method for solving the poor attachment.

SUMMARY

Embodiments provide a display device having improved attachment between an anisotropic conductive film and a circuit film.

A display device according to embodiments may include a substrate including a display area and a non-display area adjacent to the display area, lower pads disposed in the non-display area of the substrate and spaced apart from each other, upper pads disposed on the lower pads and spaced apart from each other, an anisotropic conductive film disposed between the lower pads and the upper pads, and a circuit film disposed on the upper pads. The circuit film may include first lower holes disposed between the upper pads in a plan view, and first upper holes connected to the first lower holes and having radiuses larger than radiuses of the first lower holes. The first upper holes may form first openings on an upper surface of the circuit film.

In an embodiment, the anisotropic conductive film may fill the first lower holes and the first upper holes.

In an embodiment, the display device may further include vernier-keys disposed at edges of the first upper holes on the circuit film.

In an embodiment, the circuit film may further include second lower holes spaced apart from the first lower holes and disposed between the upper pads in a plan view, and second upper holes connected to the second lower holes and having radiuses larger than radiuses of the second lower holes. The second upper holes may form second openings on the upper surface of the circuit film.

In an embodiment, the anisotropic conductive film may fill the first lower holes, the second lower holes, the first upper holes, and the second upper holes.

In an embodiment, the display device may further include vernier-keys disposed at edges of the first upper holes and edges of the second upper holes on the circuit film.

In an embodiment, the upper pads may overlap the lower pads.

A display device according to embodiments may include a substrate including a display area and a non-display area adjacent to the display area, lower pads disposed in the non-display area of the substrate and spaced apart from each other, upper pads disposed on the lower pads and spaced apart from each other, an anisotropic conductive film disposed between the lower pads and the upper pads, and a circuit film disposed on the upper pads and including holes formed between the upper pads in a plan view. The holes may have inverted trapezoidal cross-sectional shapes and may form openings on an upper surface of the circuit film.

In an embodiment, the anisotropic conductive film may fill the holes.

In an embodiment, the display device may further include vernier-keys disposed at edges of the holes on the circuit film.

A method of manufacturing a display device according to embodiments may include preparing a substrate including a display area and a non-display area adjacent to the display area, forming lower pads spaced apart from each other in the non-display area of the substrate, disposing an anisotropic conductive film on the lower pads, disposing a circuit film including forming upper pads on the anisotropic conductive film, the upper pads spaced apart from each other, forming first lower holes between the upper pads in a plan view, and forming first upper holes connected to the first lower holes and having radiuses larger than radiuses of the first lower holes, and compressing the circuit film to the substrate to bond the substrate, the lower pads, the upper pads, the circuit film, and the anisotropic conductive film. The first upper holes may form first openings on an upper surface of the circuit film.

In an embodiment, the method of manufacturing the display device may further include forming vernier-keys at edges of the first upper holes on the circuit film.

In an embodiment, the forming of the circuit film may further include forming second lower holes between the upper pads in a plan view, the second lower holes spaced apart from the first lower holes, and forming second upper holes connected to the second lower holes and having radiuses larger than radiuses of the second lower holes. The second upper holes may form second openings on the upper surface of the circuit film.

In an embodiment, the method of manufacturing the display device may further include forming vernier-keys at edges of the first upper holes and edges of the second upper holes on the circuit film.

In an embodiment, the method of manufacturing the display device may further include analyzing a compressive force of the anisotropic conductive film exposed through at least one of the first openings and the second openings.

In an embodiment, the method of manufacturing the display device may further include analyzing a curing rate of the anisotropic conductive film exposed through at least one of the first openings and the second openings.

In an embodiment, the forming of the first lower holes, the first upper holes, the second lower holes, and the second upper holes may include performing a dry etching method.

In an embodiment, the forming of the first lower holes, the first upper holes, the second lower holes, and the second upper holes may include performing a wet etching method.

In an embodiment, the forming of the first lower holes, the first upper holes, the second lower holes, and the second upper holes may include performing a punching method.

The display device according to the embodiments may include the substrate including the display area and the non-display area adjacent to the display area, lower pads disposed in the non-display area of the substrate and spaced apart from each other, the upper pads disposed on the lower pads and spaced apart from each other, the anisotropic conductive film disposed between the lower pads and the upper pads, and the circuit film disposed on the upper pads, the circuit film including the first lower holes formed between the upper pads in a plan view and the first upper holes connected to the first lower holes and having the radiuses larger than the radiuses of the first lower holes. The first upper holes may form the first openings on the upper surface of the circuit film. The holes may be formed in the circuit film including a 'T' shaped cross-sectional structure having a narrow lower portion and a wide upper portion. When the anisotropic conductive film fills the holes, attachment between the anisotropic conductive film and the circuit film may be improved. When the attachment is improved, it may be possible to prevent poor attachment between the substrate and the circuit film.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
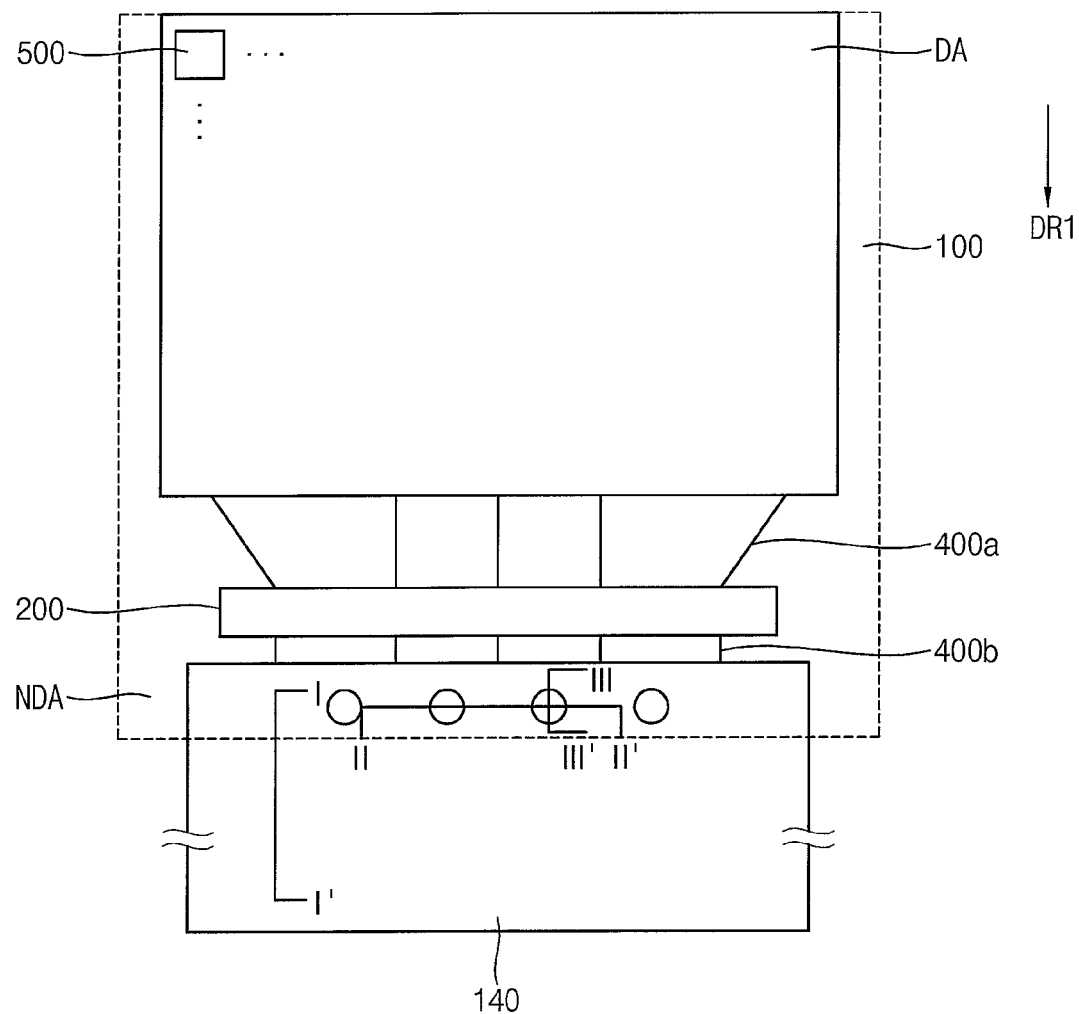
FIG. 1 is a plan view illustrating a display device according to embodiments of the invention.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or". Throughout the disclosure, the expression "at least one of A, B, and C" may indicate only A, only B, only C, both A and B, both A and C, both B and C, all of A, B, and C, or variations thereof.

The term "at least one of" is intended to include the meaning of "at least one selected from the group consisting of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be further understood that the terms "comprises," "comprising," "includes," "including," "have," "having," "contains," and/or "containing" when used in this specification, are intended to specify the presence of stated features, regions, integers, steps, operations, elements, and/or components, but do not preclude the presence or addition of one or more other features, regions, integers, steps, operations, elements, components, and/or groups thereof.

Hereinafter, display devices in accordance with embodiments will be explained in detail with reference to the accompanying drawings.

Figure 2:
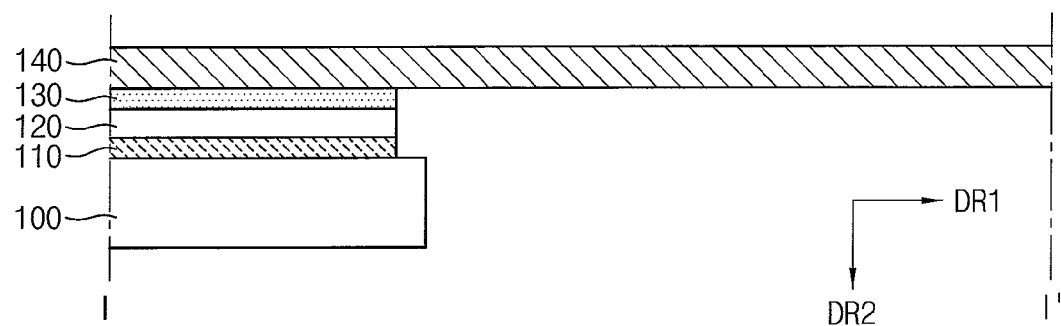
FIG. 2 is a schematic cross-sectional view illustrating an embodiment cut along line I-I' of FIG. 1.

FIG. 1 is a plan view illustrating a display device according to embodiments of the invention, and FIG. 2 is a schematic cross-sectional view illustrating an embodiment cut along the line I-I' of FIG. 1.

Referring to FIGS. 1 and 2, a display device 1000 may include a substrate 100, an integrated circuit 200, lower pads 110, an anisotropic conductive film 120, upper pads 130, a circuit film 140, wires 400a, signal wires 400b and pixels 500.

The substrate 100 may include a display area DA and a non-display area NDA adjacent to (or surrounding) the display area DA. The substrate 100 may include a transparent or opaque material. For example, the substrate 100 may include a quartz substrate, a synthetic quartz substrate, a calcium fluoride substrate, a fluorine-doped quartz substrate, a soda-lime glass substrate, a non-alkali glass substrate, and the like.

The pixels 500 may be disposed on the display area DA of the substrate 100. Each of the pixels 500 may include a first electrode, a light emitting layer, and a second electrode. The pixels 500 may be entirely arranged in the display area DA in a matrix form. However, embodiments of the invention are not limited thereto, and the pixels 500 may be arranged in various forms in the display area DA. The display device 1000 may display an image on the display area DA through the pixels 500.

The integrated circuit 200 may be disposed on the non-display area NDA of the substrate 100. The integrated circuit 200 may be disposed in a first direction DR1 from the display area DA. The integrated circuit 200 may transmit signals (for example, data signal, gate signal, emission control signal, gate initialization signal, initialization voltage, power supply voltage, etc.) to the display area DA through the wires 400a. The integrated circuit 200 may receive the signals generated from an external device through a signal wires 400b. The integrated circuit 200 may transmit the signals to the display area DA through the wires 400a. In FIG. 1, the integrated circuit 200 is illustrated as being disposed in the non-display area NDA on the substrate 100, but is not limited thereto. For example, the integrated circuit 200 may be disposed on the circuit film 140.

The wires 400a may be disposed on the non-display area NDA of the substrate 100. The wires 400a may be disposed between the display area DA and the integrated circuit 200. The wires 400a may electrically connect the integrated circuit 200 disposed in the non-display area NDA and the pixels 500 disposed in the display area DA. The wires 400a may include data signal wires, gate signal wires, emission control signal wires, gate initialization signal wires, initialization voltage wires, power supply voltage wires, and the like The lower pads 110 may be disposed on the non-display area NDA of the substrate 100. The lower pads 110 may be disposed in the first direction DR1 from the integrated circuit 200. The lower pads 110 may include a conductive material. The anisotropic conductive film 120 may be disposed on the lower pads 110. The upper pads 130 may be disposed on the anisotropic conductive film 120. The upper pads 130 may include the conductive material. The circuit film 140 may be disposed on the upper pads 130. The circuit film 140 may provide the signals to the display area DA. In an embodiment, the circuit film 140 may include a flexible printed circuit board (FPCB). When the flexible printed circuit board is bent, a bezel area of the display device 1000 may be reduced. In an embodiment, the circuit film 140 may include a polyimide film.

The circuit film 140 may be bent in a second direction DR2 perpendicular to the first direction DR1. Stress may occur in a direction opposite to a bending direction of the circuit film 140 in a portion where the circuit film 140 is attached to the substrate 100. Due to the stress, crack or floating may occur in the circuit film 140 attached to the anisotropic conductive film 120. Holes may be formed in the circuit film 140 to prevent the crack and the floating.

The signal wires 400b may be disposed on the non-display area NDA of the substrate 100. The signal wires 400b may be disposed between the integrated circuit 200 and the circuit film 140. The signal wires 400b may transfer the signals transmitted from the circuit film 140 to the integrated circuit 200. The signal wires 400b may include the data signal wires, the gate signal wires, the emission control signal wires, the gate initialization signal wires, the initialization voltage wires, and the power supply voltage wires. The signal wires 400b may be connected to the lower pads 110.

Figure 3:
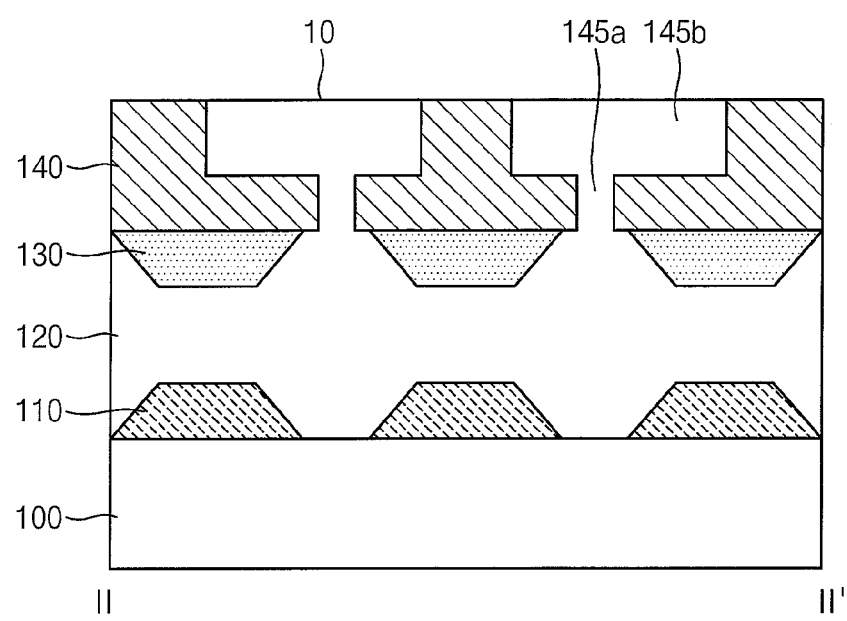
FIG. 3 is a schematic cross-sectional view illustrating an embodiment cut along line II-IP of FIG. 1.
Figure 4:
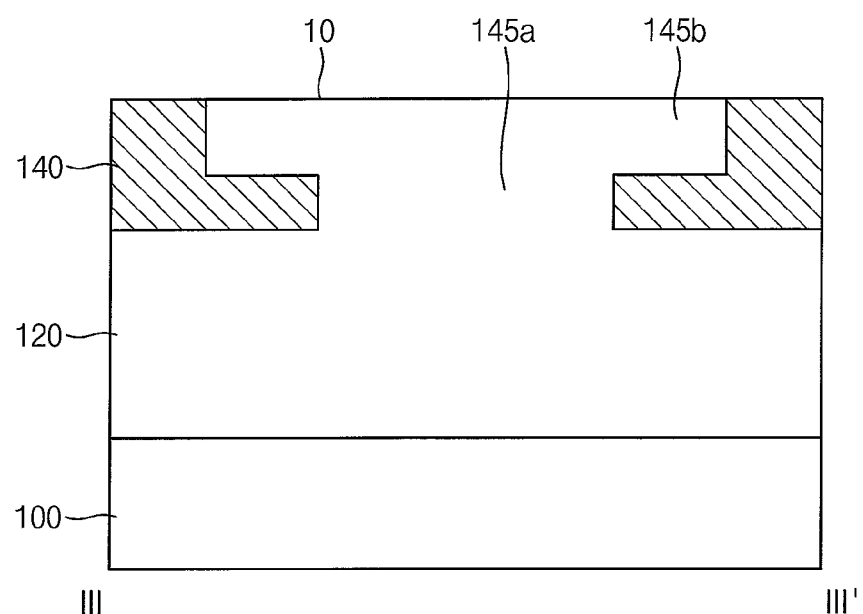
FIG. 4 is a schematic cross-sectional view illustrating an embodiment cut along line in FIG. 1.

FIG. 3 is a schematic cross-sectional view illustrating an embodiment cut along the line II-II' of FIG. 1, and FIG. 4 is a schematic cross-sectional view illustrating an embodiment cut along the line III-III' in FIG. 1.

Referring to FIGS. 1 to 4, lower pads 110 may be disposed on the non-display area NDA of the substrate 100. In an embodiment, the display device may include first to n-th lower pads, where n is a natural number of 2 or more. The lower pads 110 may be spaced apart from each other. Space formed by the lower pads 110 may be filled by the anisotropic conductive film 120. Through this, the anisotropic conductive film 120 and the substrate 100 may be attached. The lower pads 110 may directly contact the substrate 100. The lower pads 110 may extend in the first direction DR1. The lower pads 110 may transmit the signals received through the circuit film 140 to the display area DA.

The anisotropic conductive film 120 may be disposed on the lower pads 110. The anisotropic conductive film 120 may transmit the signals received through the circuit film 140 to the lower pads 110. The anisotropic conductive film 120 may attach the substrate 100 on which the lower pads 110 are formed and the circuit film 140 on which the upper pads 130 are formed.

Upper 130 may be disposed on the anisotropic conductive film 120. In an embodiment, the display device may include first to m-th upper pads, where m is a natural number of 2 or more. The upper pads 130 may be spaced apart from each other. Space formed by the upper pads 130 may be filled by the anisotropic conductive film 120. Through this, the upper pads 130 and the anisotropic conductive film 120 may be attached. The upper pads 130 may directly contact the circuit film 140. The upper pads 130 may extend in the first direction DR1. The upper pads 130 may transmit the signals received through the circuit film 140 to the anisotropic conductive film 120. In an embodiment, the upper pads 130 may overlap the lower pads 110.

The circuit film 140 may be disposed on the upper pads 130. First lower holes 145a may be formed in the circuit film 140 between the first to m-th upper pads in a plan view. First upper holes 145b may be formed on the first lower holes 145a. The first lower holes 145a and the first upper holes 145b may be connected. Radiuses of the first upper holes 145b may be greater than radiuses of the first lower holes 145a. Although a cross-section of the first lower holes 145a and the first upper holes 145b are illustrated in square shapes, embodiments of the invention are not limited thereto. For example, a cross-section of each of the first lower holes 145a and the first upper holes 145b may be polygonal shapes, circular shapes, and the like. The anisotropic conductive film 120 may fill the first lower holes 145a and the first upper holes 145b. The first upper holes 145b may form first openings 10 on an upper surface of the circuit film 140. The first lower holes 145a and the first upper holes 145b may be formed to be spaced apart in a direction perpendicular to the first direction DR1 and the second direction DR2.

The circuit film 140 may be bent in the second direction DR2. Stress may occur in the anisotropic conductive film 120 in a direction opposite to the bending direction of the circuit film 140. Due to the stress, cracking or floating may occur between the anisotropic conductive film 120 and the circuit film 140. In an embodiment, the anisotropic conductive film 120 may fill the first upper holes 145b and the first lower holes 145a. When the anisotropic conductive film 120 fills the first lower holes 145a and the first upper holes 145b, the stress may be offset. When the anisotropic conductive film 120 fills the first lower holes 145a and the first upper holes 145b, cracking, floating, and the like may be prevented. For example, when the anisotropic conductive film 120 fills the first lower holes 145a and the first upper holes 145b, attachment between the circuit film 140 and the anisotropic conductive film 120 may be strengthened.

Figure 5:
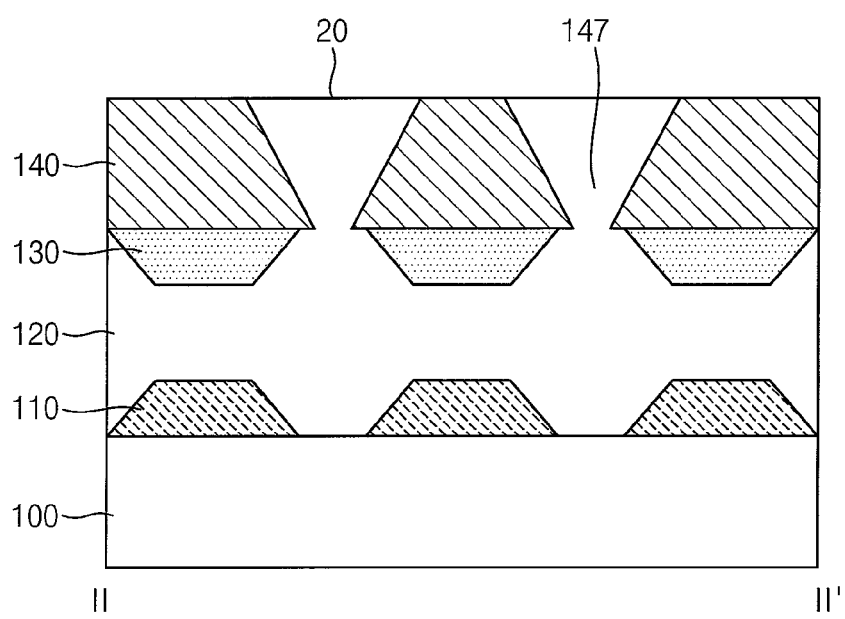
FIG. 5 is a schematic cross-sectional view illustrating another embodiment cut along line II-II' of FIG. 1.
Figure 6:
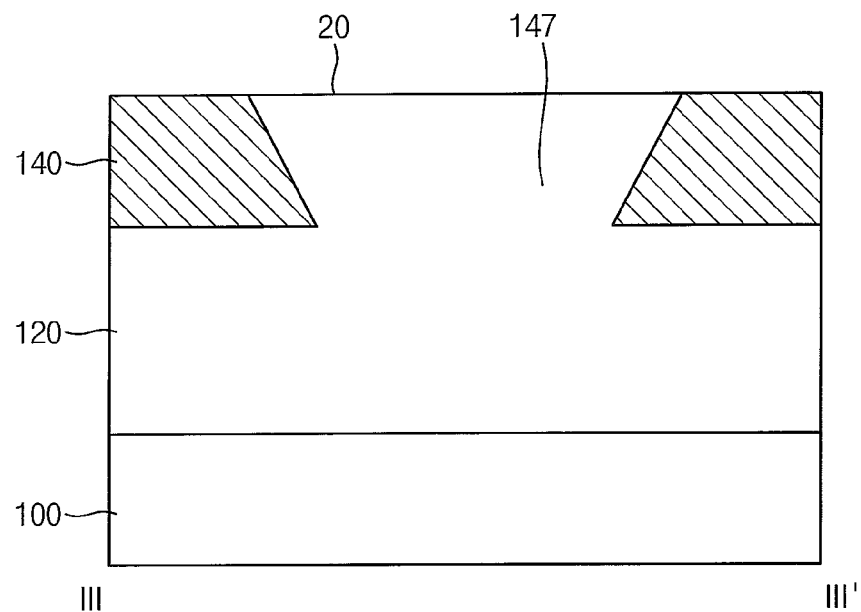
FIG. 6 is a schematic cross-sectional view illustrating another embodiment cut along line III-III' in FIG. 1.

FIG. 5 is a schematic cross-sectional view illustrating another embodiment cut along the line II-II' of FIG. 1, and FIG. 6 is a schematic cross-sectional view illustrating another embodiment cut along the line III-III' in FIG. 1.

Referring to FIGS. 1, 2, 5 and 6, holes 147 may be formed in the circuit film 140 between the upper pads 130 in a plan view. A cross-section of the holes 147 may have inverted trapezoidal cross-sectional shapes. The holes 147 may form openings 20 on the upper surface of the circuit film 140. The anisotropic conductive film 120 may fill the holes 147. When the anisotropic conductive film 120 fills the holes 147, the stress 140 may be offset. When the anisotropic conductive film 120 fills the holes 147, cracking, floating, and the like may be prevented. When the anisotropic conductive film 120 fills the holes 147, the attachment of the circuit film 140 may be enhanced.

Figure 7:
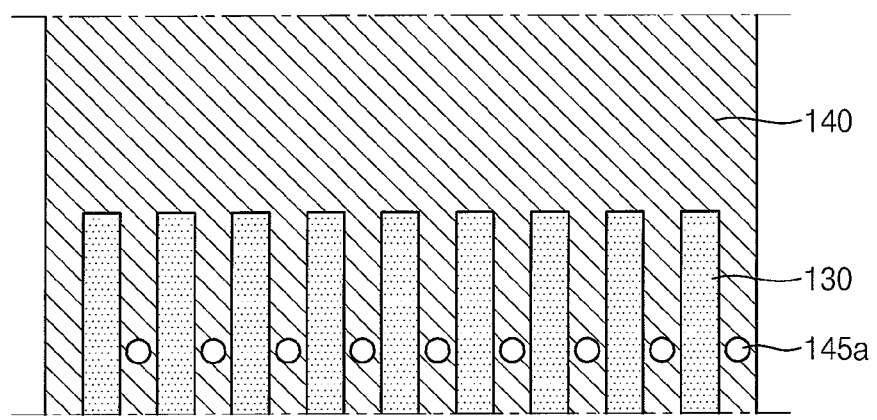
FIGS. 7 and 8 are schematic diagrams illustrating an embodiment of a circuit film included in the display device of FIG. 1.
Figure 8:
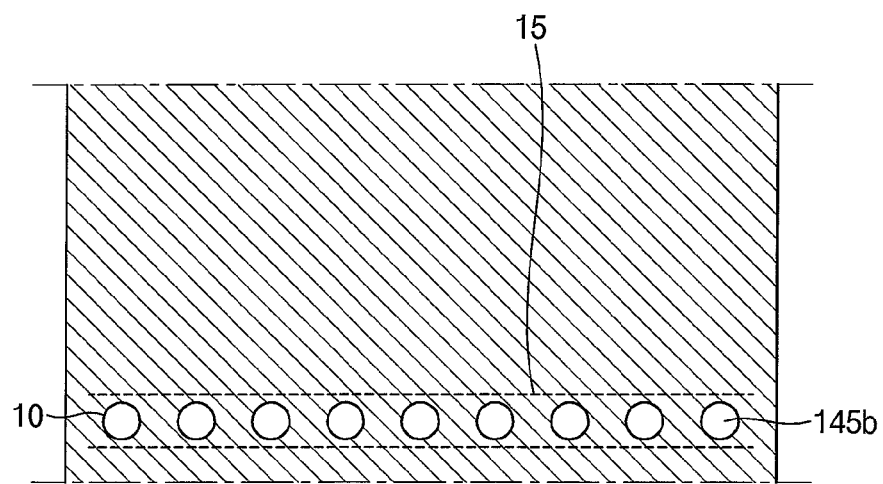

FIGS. 7 and 8 are schematic diagrams illustrating an embodiment of a circuit film included in the display device of FIG. 1. FIG. 7 may illustrate a lower surface of the circuit film 140, and FIG. 8 may show an upper surface of the circuit film 140.

Referring to FIG. 7, the upper pads 130 may be spaced apart from each other on the lower surface of the circuit film 140. The first lower holes 145a may be formed in the circuit film 140 between the upper pads 130 in a plan view. The first lower holes 145a may be spaced apart from each other.

Referring to FIG. 8, the first upper holes 145b may be formed in connection with the first lower holes 145a. The first upper holes 145b may be spaced apart from each other. The first upper holes 145b may form the first openings 10 on the upper surface of the circuit film 140. In an embodiment, the anisotropic conductive film 120 may fill the first upper holes 145b and the first lower holes 145a. A vernier-key 15 may be formed on edges of the first upper holes 145b. The vernier-key 15 may be formed by a printing method. The vernier-key 15 may serve as a scale. When the anisotropic conductive film 120 is compressed, the anisotropic conductive film 120 may be compressed so as not to exceed the vernier-key 15. When the anisotropic conductive film 120 is compressed, the anisotropic conductive film 120 may be compressed to reach the vernier-key 15. In the display device 1000, the compressive force may be analyzed through the vernier-key 15 without additional inspection.

Figure 9:
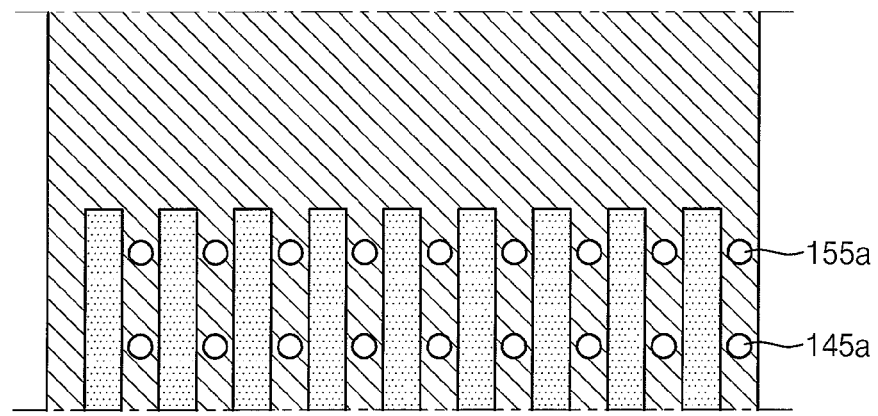
FIGS. 9 and 10 are schematic diagrams illustrating another embodiment of a circuit film included in the display device of FIG. 1.
Figure 10:
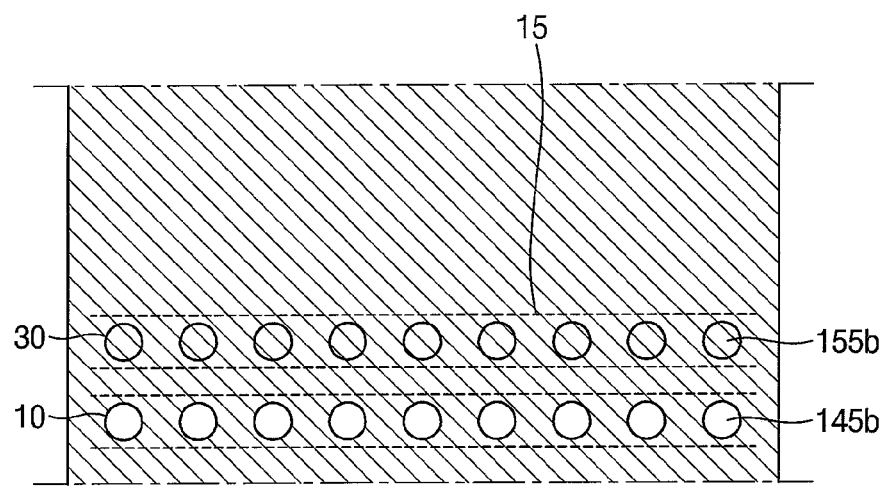

FIGS. 9 and 10 are schematic diagrams illustrating another embodiment of a circuit film included in the display device of FIG. 1. FIG. 9 may illustrate a lower surface of the circuit film 140, and FIG. 10 may show an upper surface of the circuit film 140.

Referring to FIG. 9, the first lower holes 145a may be formed in the lower surface of the circuit film 140 between the upper pads 130 in a plan view. Between the upper pads 130, second lower holes 155a spaced apart from the first lower holes 145a may be further formed. The second lower holes 155a may be spaced apart from each other. In an embodiment, the first lower holes 145a and the second lower holes 155a may have same radiuses. However, embodiments of the invention are not limited thereto, and the radiuses of the first lower holes 145a and the radiuses of the second lower holes 155a may be different.

Referring to FIG. 10, second upper holes 155b spaced apart from the first upper holes 145b may be further formed in the circuit film 140. The second upper holes 155b may be connected to the second lower holes 155a. The second upper holes 155b may be formed to be spaced apart from each other. Radiuses of the second upper holes 155b may be greater than the radiuses of the second lower holes 155a. The first upper holes 145b and the second upper holes 155b may form second openings 30 on the upper surface of the circuit film 140. In an embodiment, the anisotropic conductive film 120 may fill the first lower holes 145a, the second lower holes 155a, the first upper holes 145b, and the second upper holes 155b. In an embodiment, the vernier-key 15 may be formed on the edges of the first upper holes 145b, and the vernier-key 15 may be formed on edges of the second upper holes 155b. In the display device 1000, the compressive force may be analyzed through the vernier-key 15 without additional inspection. However, in order to prevent poor attachment in the display device 1000, holes may be further formed in the circuit film 140.

FIGS. 11A to 11E are schematic diagrams illustrating a method of manufacturing a display device.

Figure 11A:
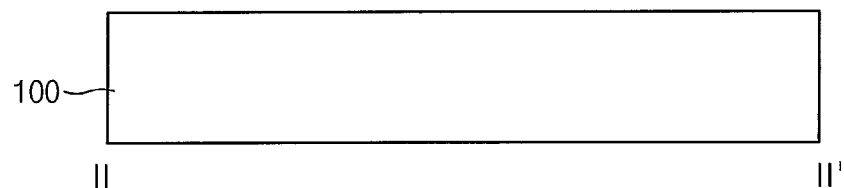
FIGS. 11A to 11E are schematic diagrams illustrating a method of manufacturing a display device.

Referring to FIGS. 1 and 11A, the substrate 100 including the display area DA and the non-display area NDA may be prepared.

Figure 11B:
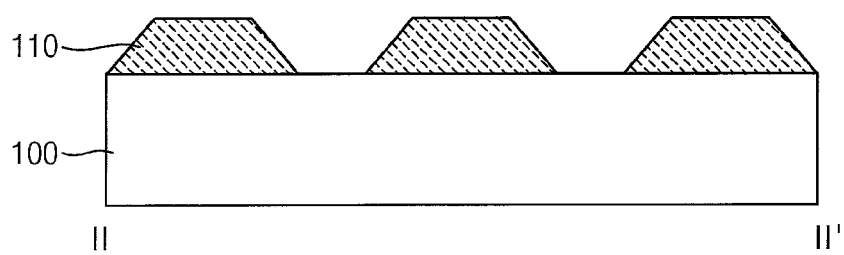

Referring to FIGS. 1 and 11B, the lower pads 110 may be formed on the non-display area NDA of the substrate 100. The lower pads 110 may be formed by partially etching a lower pad layer after the lower pad layer is entirely formed on the substrate 100. In an embodiment, the lower pads 110 may be formed by dry etching the lower pad layer. In another embodiment, the lower pads 110 may be formed by wet etching the lower pad layer.

Figure 11C:
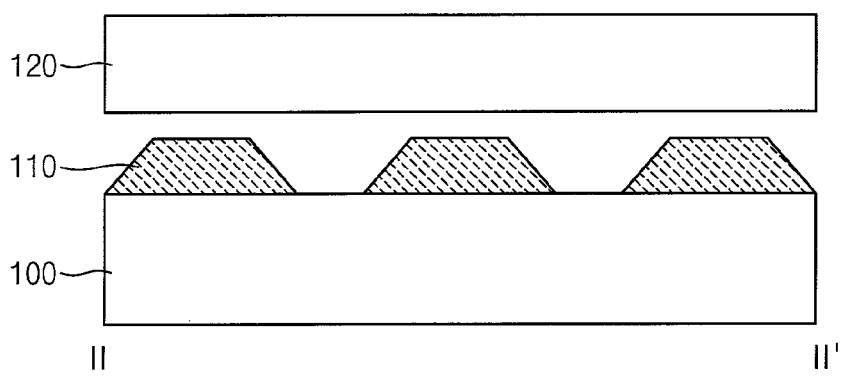

Referring to FIG. 11C, the anisotropic conductive film 120 may be disposed on the lower pads 110.

Figure 11D:
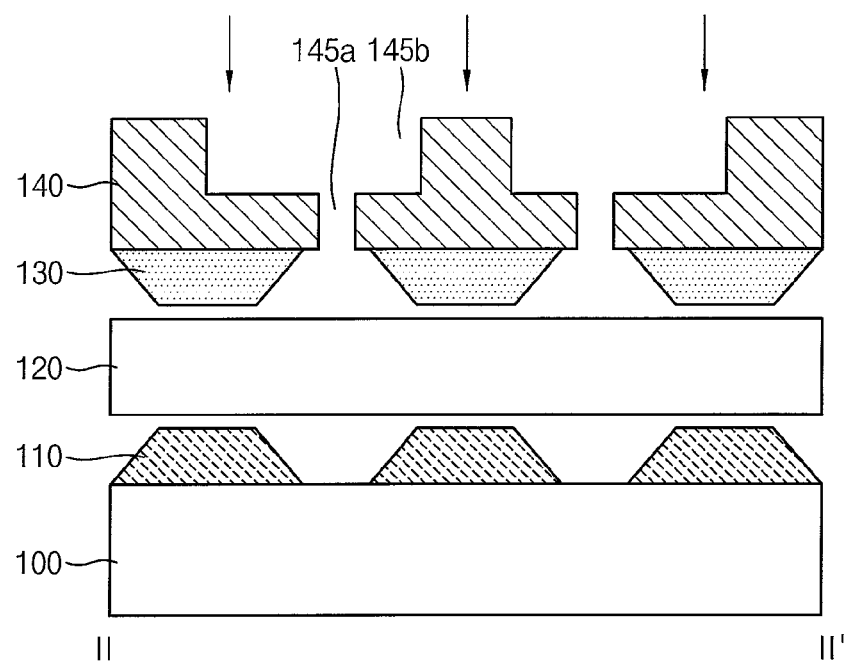

Referring to FIGS. 7, 8 and 11D, the circuit film 140 may be disposed on the anisotropic conductive film 120. The upper pads 130 may be formed on the lower surface of the circuit film 140. The upper pads 130 may be formed by partially etching an upper pad layer after the upper pad layer is entirely formed on the circuit film 140. In an embodiment, the upper pads 130 may be formed by dry etching the upper pad layer. In another embodiment, the upper pads 130 may be formed by wet etching the upper pad layer. The first lower holes 145a may be formed between the upper pads 130 in a plan view. The first upper holes 145b may be formed on the first lower holes 145a. The first lower holes 145a and the first upper holes 145b may be connected. The radiuses of the first upper holes 145b may be larger than the radiuses of the first lower holes 145a. In an embodiment, the first upper holes 145b and the first lower holes 145a may be sequentially formed. For example, the first upper holes 145b may be formed, and the first lower holes 145a may be formed after the first upper holes 145b are formed.

The first upper holes 145b and the first lower holes 145a may be formed by etching the circuit film 140. In an embodiment, the first lower holes 145a and the first upper holes 145b may be formed by a wet etching method. In another embodiment, the first lower holes 145a and the first upper holes 145b may be formed by a dry etching method. In still another embodiment, the first lower holes 145a and the first upper holes 145b may be formed by applying a physical force. For example, the first lower holes 145a and the first upper holes 145b may be formed by a punching method.

As illustrated in FIG. 5, when the holes 147 having inverted trapezoidal cross-sectional shapes are formed in the circuit film 140, each of the holes 147 may be formed at one time.

In an embodiment, the vernier-key 15 may be formed on the edges of the first upper holes 145b. The vernier-key 15 may be formed by a printing method. In an embodiment, the compressive force of the anisotropic conductive film 120 may be analyzed through the anisotropic conductive film 120 exposed through at least one of the first opening 10 and the second opening 30. Based on whether the anisotropic conductive film 120 exceeds the vernier-key 15, it may be determined whether the compressive force of the anisotropic conductive film 120 is within an allowable range. Through the analysis of the compressive force, poor attachment in the display device 1000 may be identified in advance. Since the anisotropic conductive film 120 is exposed to an outside through the openings 10 and 30, the compressive force of the anisotropic conductive film 120 may be analyzed without disassembling the display device 1000. In an embodiment, compression-nondestructive testing and analysis may be performed through the anisotropic conductive film 120 exposed by the openings 10 and 30. In another embodiment, the vernier-key 15 may be formed in two rows around the opening 10. By checking the size at which the anisotropic conductive film 120 is formed through the vernier-key 15 formed in two rows, the compressive force of the anisotropic conductive film 120 may be analyzed. In still another embodiment, the compressive force of the anisotropic conductive film 120 may be analyzed using a camera. For example, after the camera photographs whether the anisotropic conductive film 120 reaches the vernier-key 15, the compressive force of the anisotropic conductive film 120 may be analyzed.

Figure 11E:
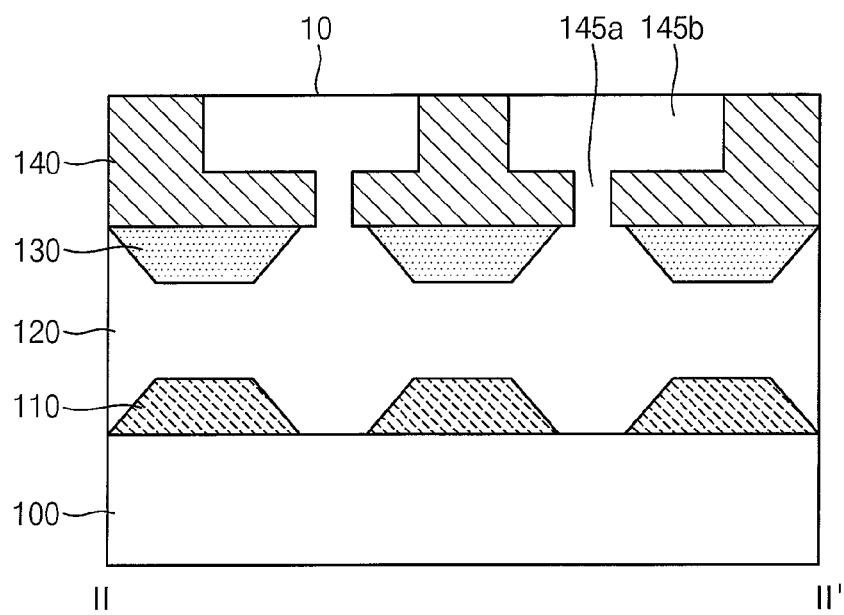

Referring to FIG. 11E, the circuit film 140 may be compressed to attach the substrate 100, the lower pads 110, the upper pads 130 and the circuit film 140, and the anisotropic conductive film 120. The compression may be performed by thermal compression, ultrasonic compression, or the like. By the compressing, the anisotropic conductive film 120 may fill a space between the lower pads 110 spaced apart from each other, and also fill a space between the upper pads 130 spaced apart from each other. The anisotropic conductive film 120 may fill holes formed in the circuit film 140 by the compressing.

As illustrated in FIGS. 9 and 10, second lower holes 155a spaced apart from the first lower holes 145a between the upper pads 130 in a plan view may be further formed in the circuit film 140. Second upper holes 155b spaced apart from the first upper holes 145b may be further formed in the circuit film 140. The second upper holes 155b may be connected to the second lower holes 155a. Radiuses of the second upper holes 155b may be greater than radiuses of the second lower holes 155a. The first upper holes 145b and the second upper holes 155b may form openings on the upper surface of the circuit film 140. In an embodiment, the vernier-key 15 may be formed on the edges of the first upper holes 145b. The vernier-key 15 may also be formed on the edges of the second upper holes 155b. In an embodiment, the anisotropic conductive film 120 may fill the first lower holes 145a, the second lower holes 155a, the first upper holes 145b, and the second upper holes 155b. In an embodiment, the second upper holes 155b and the second lower holes 155a may be sequentially formed. For example, the second lower holes 155a may be formed after the second upper holes 155b are formed. In an embodiment, the second lower holes 155a and the second upper holes 155b may be formed by a wet etching method. In another embodiment, the second lower holes 155a and the second upper holes 155b may be formed by a dry etching method. In still another embodiment, the second lower holes 155a and the second upper holes 155b may be formed by applying the physical force. For example, the second lower holes 155a and the second upper holes 155b may be formed by a punching method.

In an embodiment, a curing rate of the anisotropic conductive film 120 may be analyzed through the anisotropic conductive film 120 exposed through at least one of the first opening 10 and the second opening 30. For example, the curing rate of the anisotropic conductive film 120 may be analyzed through FT-IR analysis. Through the analysis of the curing rate, the adhesion failure of the display device 1000 may be identified in advance.

Figure 12:
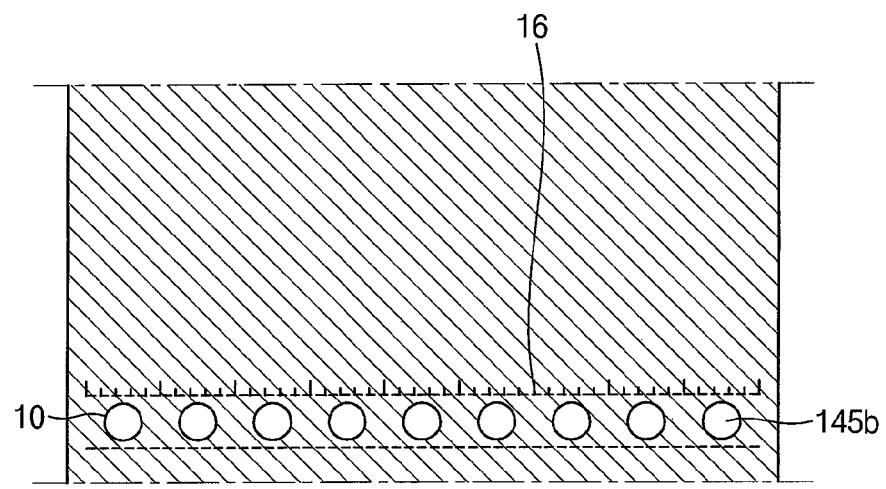
FIG. 12 is a schematic diagram illustrating still another embodiment of a circuit film included in the display device of FIG. 1.

FIG. 12 is a schematic diagram illustrating still another embodiment of a circuit film included in the display device of FIG. 1.

Referring to FIGS. 3 and 12, the first upper holes 145b may be formed in the upper surface of the circuit film 140. The first upper holes 145b may form the opening 10 on the upper surface of the circuit film 140. A vernier-key 16 may be printed around the opening 10. A scale such as a ruler may be displayed on the vernier-key 16. In an embodiment, by checking the size of the anisotropic conductive film 120 through the scale, the compressive force of the anisotropic conductive film 120 may be analyzed.

The display device and the method of manufacturing the display device according to the embodiments may be applied to a display device including the bending structure.

Although the display device according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
   a substrate including a display area and a non-display area adjacent to the display area;
   lower pads disposed in the non-display area of the substrate and spaced apart from each other;
   upper pads disposed on the lower pads and spaced apart from each other;
   an anisotropic conductive film disposed between the lower pads and the upper pads; and
   a circuit film disposed on the upper pads, the circuit film including:
      first lower holes disposed between the upper pads in a plan view;
      first upper holes connected to the first lower holes and having radiuses larger than radiuses of the first lower holes; and
      vernier-keys disposed at edges of the first upper holes on the circuit film,
   wherein the first upper holes form first openings on an upper surface of the circuit film, and
   wherein the vernier-keys are configured to include a scale to analyze compressive forces imposed on the anisotropic conductive film.

2. The display device of claim 1, wherein the anisotropic conductive film fills the first lower holes and the first upper holes.

3. The display device of claim 1, wherein the circuit film further includes:

second lower holes spaced apart from the first lower holes and disposed between the upper pads in a plan view; and second upper holes connected to the second lower holes and having radiuses larger than radiuses of the second lower holes, wherein the second upper holes form second openings on the upper surface of the circuit film.

4. The display device of claim 3, wherein the anisotropic conductive film fills the first lower holes, the second lower holes, the first upper holes, and the second upper holes.

5. The display device of claim 3, wherein the vernier-keys are disposed at edges of the first upper holes and edges of the second upper holes on the circuit film.

6. The display device of claim 1, wherein the upper pads overlap the lower pads.

7. A method of manufacturing a display device, comprising:

preparing a substrate including a display area and a non-display area adjacent to the display area;

forming lower pads spaced apart from each other in the non-display area of the substrate;

disposing an anisotropic conductive film on the lower pads;

disposing a circuit film including:
  forming upper pads on the anisotropic conductive film, the upper pads spaced apart from each other;
  forming first lower holes between the upper pads in a plan view;
  forming first upper holes connected to the first lower holes and having radiuses larger than radiuses of the first lower holes; and
  forming vernier-keys disposed at edges of the first upper holes on the circuit film; and compressing the circuit film to the substrate to bond the substrate, the lower pads, the upper pads, the circuit film, and the anisotropic conductive film, wherein the first upper holes form first openings on an upper surface of the circuit film, and the vernier-keys are configured to include a scale to analyze compressive forces imposed on the anisotropic film.

8. The method of claim 7, wherein the forming of the circuit film includes:

forming second lower holes between the upper pads in a plan view, the second lower holes spaced apart from the first lower holes; and forming second upper holes connected to the second lower holes and having radiuses larger than radiuses of the second lower holes, wherein the second upper holes form second openings on the upper surface of the circuit film.

9. The method of claim 8, further comprising:

forming the vernier-keys at edges of the second upper holes on the circuit film.

10. The method of claim 8, further comprising:

analyzing a compressive force of the anisotropic conductive film exposed through at least one of the first openings and the second openings.

11. The method of claim 8, further comprising:

analyzing a curing rate of the anisotropic conductive film exposed through at least one of the first openings and the second openings.

12. The method of claim 8, wherein the forming of the first lower holes, the first upper holes, the second lower holes, and the second upper holes includes performing a dry etching method.

13. The method of claim 8, wherein the forming of the first lower holes, the first upper holes, the second lower holes, and the second upper holes includes performing a wet etching method.

14. The method of claim 8, wherein the forming of the first lower holes, the first upper holes, the second lower holes, and the second upper holes includes performing a punching method.

* * * * *